United States Patent
Hyde et al.

(10) Patent No.: US 6,828,789 B2
(45) Date of Patent: Dec. 7, 2004

(54) CAVITY RESONATOR FOR ELECTRON PARAMAGNETIC RESONANCE SPECTROSCOPY HAVING AXIALLY UNIFORM FIELD

(75) Inventors: James S. Hyde, Dousman, WI (US); Richard R. Mett, Cedarburg, WI (US); Wojciech Froncisz, Krakow (PL); James R. Anderson, Cedar Grove, WI (US)

(73) Assignee: The MCW Research Foundation, Inc., Milwaukee, WI (US)

( * ) Notice: Subject to any disclaimer, the term of this patent is extended or adjusted under 35 U.S.C. 154(b) by 0 days.

(21) Appl. No.: 10/200,885

(22) Filed: Jul. 23, 2002

(65) Prior Publication Data

US 2003/0038633 A1 Feb. 27, 2003

Related U.S. Application Data

(60) Provisional application No. 60/371,827, filed on Apr. 11, 2002, and provisional application No. 60/307,701, filed on Jul. 25, 2001.

(51) Int. Cl.[7] ............................................... G01V 3/00
(52) U.S. Cl. .................... 324/316; 324/300; 324/307
(58) Field of Search ........................ 324/300, 307–310, 324/316–318, 321, 309; 333/219, 227–234

(56) References Cited

U.S. PATENT DOCUMENTS

| | | | |
|---|---|---|---|
| 3,358,222 A | | 12/1967 | Hyde |
| 3,559,043 A | * | 1/1971 | Hyde .......................... 324/316 |
| 3,714,550 A | * | 1/1973 | Hyde .......................... 324/316 |
| 3,757,204 A | | 9/1973 | Hyde |
| 3,879,653 A | * | 4/1975 | Hyde et al. .................. 324/316 |
| 3,931,569 A | | 1/1976 | Hyde |
| 4,185,237 A | * | 1/1980 | Uehara et al. ............... 324/317 |
| 4,423,397 A | * | 12/1983 | Nishikawa et al. ....... 333/219.1 |
| 4,446,429 A | | 5/1984 | Froncisz et al. |
| 4,633,180 A | | 12/1986 | Biehl et al. |
| 5,194,815 A | * | 3/1993 | Maeno ........................ 324/501 |
| 5,389,878 A | * | 2/1995 | Nakagawa et al. .......... 324/316 |
| 5,465,047 A | * | 11/1995 | Nakanishi et al. ........... 324/316 |
| 5,714,920 A | * | 2/1998 | Ivanov et al. ............. 333/219.1 |
| 5,949,237 A | * | 9/1999 | Berger et al. ................ 324/636 |
| 5,990,767 A | * | 11/1999 | Ivanov et al. ............. 333/219.1 |

* cited by examiner

*Primary Examiner*—Diego Gutierrez
*Assistant Examiner*—Dixomara Vargas
(74) *Attorney, Agent, or Firm*—Quarles & Brady LLP (57) ABSTRACT

A uniform-field resonator includes a central cavity section having a cross-section which is set to the cutoff frequency for a particular microwave propagation mode and a pair of end sections which enclose the cavity to form a resonator in which the field is substantially uniform along the entire length of the central cavity—regardless of its length. A number of end section design strategies and resulting structures are described for supporting the uniform-field mode of operation in the central cavity section.

34 Claims, 8 Drawing Sheets

CAVITY RESONATOR FOR ELECTRON PARAMAGNETIC RESONANCE SPECTROSCOPY HAVING AXIALLY UNIFORM FIELD

CROSS-REFERENCE TO RELATED APPLICATIONS

This application claims the benefit of U.S. Provisional patent application Ser. No. 60/307,701 filed on Jul. 25, 2001 and entitled "Axially Uniform Resonant Cavity Modes For Potential Use In Electron Paramagnetic Resonance Spectroscopy" and U.S. Provisional patent application Ser. No. 60/371,827 filed On Apr. 11, 2002 and entitled "Cavities With Axially Uniform Fields For Use In Electron Paramagnetic Resonance".

STATEMENT REGARDING FEDERALLY SPONSORED RESEARCH

This invention was made with government support under Grant Nos. GM27665 and RR01008 awarded by the National Institutes of Health. The United States Government has certain rights in this invention.

BACKGROUND OF THE INVENTION

The field of the invention is microwave resonators, and particularly, resonators employed in electron paramagnetic resonance spectroscopy.

Electron paramagnetic resonance spectroscopy is conducted to study electrons which are in a paramagnetic state and which is called electron paramagnetic resonance (EPR) or electron spin resonance (ESR). In electron paramagnetic resonance spectroscopy a sample to be investigated is subjected to a polarizing magnetic field and one or more radio frequency magnetic fields. The frequency, strength, direction, and modulation of the applied magnetic fields varies considerably depending upon the particular phenomena being studied. Apparatus such as that disclosed in U.S. Pat. Nos. 3,358,222 and 3,559,043 have been employed for performing such experiments in laboratories. Samples which are the subject of the EPR measurement are placed in a microwave resonator where they are subjected to the RF magnetic field. The microwave resonator may take the form of a cavity resonator such as that disclosed in U.S. Pat. Nos. 3,931,569 and 3,757,204, or it may be a loop-gap resonator such as that disclosed in U.S. Pat. No. 4,446,429. A major objective of the resonator is to apply a uniform RF magnetic field throughout the extent of the sample.

Loop-gap resonators (LGR) have become a preferred resonator geometry for experiments at frequencies below X band. Cavity resonators are generally preferred at higher frequencies to about 100 GHz, with Fabry-Perot resonators preferred at ultrahigh frequencies. Both LGRs and cavity resonators are in common use at X-band (10 GHz), Q-band (35 GHz) and S-band (3 GHz), which are by far the most widely used frequency for EPR experiments. The reason for these preferences is primarily convenience. Cavity resonators are awkwardly large at S band, LGRs become extremely small at Q band, and cavity resonators are, in turn, too small to handle easily at ultrahigh frequencies.

A benefit of LGRs is that the length to diameter ratio of the sample-containing loop is typically about five, resulting in a relatively uniform microwave field over the sample. This is a substantial benefit in experiments using line samples that extend through the resonator, since all portions of the sample respond in the same way to the incident microwave field. For cavity resonators on the other hand, the microwave field varies cosinusoidally over the sample, with the number of half cycles of variation determined by the selected index of the microwave resonant mode—usually one half cycle.

SUMMARY OF THE INVENTION

The present invention is a resonator for use in applications where a highly uniform RF magnetic field is desired along an axial dimension. More specifically, the resonator includes a central cavity section having cross-sectional dimensions set to establish a cutoff condition for a selected RF wave propagation mode and frequency; and a pair of uniform-field supporting end sections connected to each end of the central cavity section. It has been discovered that when the central cavity section is operated at the cutoff frequency for a transverse electric propagation mode, the RF fields produced along the entire axial length of the central cavity section are substantially uniform regardless of its length. A sample placed in the central cavity section and disposed along its axis is thus subjected to a substantially uniform RF magnetic field.

A general object of the invention is to apply a substantially uniform RF field to a sample during an EPR experiment. The sample may be contained in a tube or a cuvette which is mounted along the axis of the central cavity section. The sample is subjected to substantially the same RF magnetic field along its entire axial length, regardless of its length.

The foregoing and other objects and advantages of the invention will appear from the following description. In the description, reference is made to the accompanying drawings which form a part hereof, and in which there is shown by way of illustration a preferred embodiment of the invention. Such embodiment does not necessarily represent the full scope of the invention, however, and reference is made therefore to the claims and herein for interpreting the scope of the invention.

DETAILED DESCRIPTION OF THE PREFERRED EMBODIMENT

Figure 1:
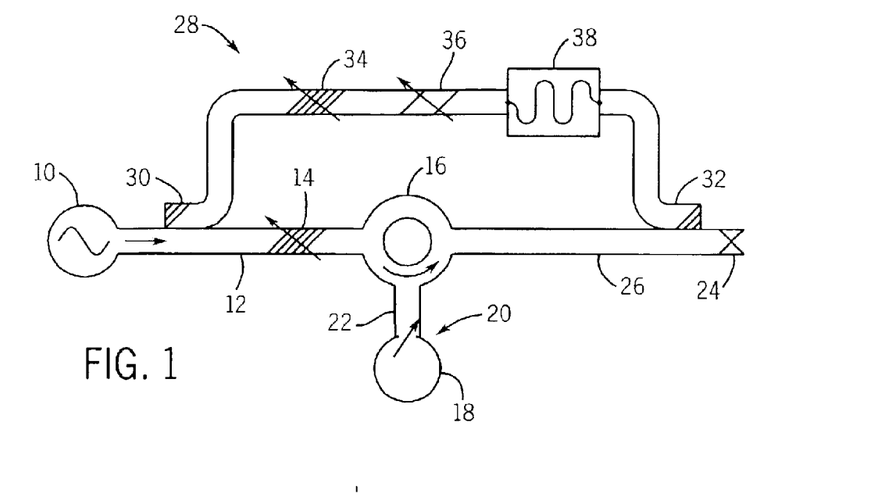
FIG. 1 is a schematic diagram of an electron spin resonance spectrometer which employs a resonator that embodies the present invention.

Referring particularly to FIG. 1, an EPR spectrometer system includes an oscillator 10 which produces radio frequency (RF) power at the desired frequency. Klystrons are typically used to produce over 200 mW of power at a frequency in the 9 to 10 GHz range. The RF power produced by oscillator 10 is conveyed through a waveguide 12, attenuator 14, and microwave circulator 16 to a resonator 18 containing a sample to be tested. An adjustable iris 20 connects the sample resonator 18 to waveguide segment 22 and is used to match the impedances of these two elements.

Samples subjected to RF energy in the resonator 18 produce responsive signals which are conveyed to a detector crystal 24 through the circulator 16 and a waveguide segment 26. A reference signal is also applied to the detector crystal 24 by a reference arm 28. The reference arm 28 includes a directional coupler 30 which diverts RF power from the waveguide segment 12 and couples that RF power, suitably attenuated, phase shifted and delayed, to the detector crystal 24 through a second directional coupler 32. Signal attenuator 34, phase shifter 36 and delay line 38 provide precise control over the reference RF power. Not shown in FIG. 1 is a magnet which produces a strong polarizing magnetic field that establishes the frequency of the measurement to be performed.

The "uniform-field resonators" of the present invention may be used as the sample resonator 18 in this EPR spectrometer. The RF power applied to the sample and the resulting RF signals produced by the sample may be coupled to and from the interior of the uniform-field resonator through a waveguide that interfaces with a slot in the conductive wall. In the alternative, loops of wire supported inside the resonator cavity and connected through openings in the resonator conductive wall to the EPR spectrometer may be employed to apply and receive the RF energy supplied through a coaxial transmission line.

There are a wide variety of EPR spectrometers known in the art and the uniform-field resonators of the present invention may be used in any of them as an alternative to the conventional cavity resonator.

The present invention pertains to the resonator 18. More specifically, a new class of resonators has been discovered which produces a uniform RF field in the resonator cavity 18 which contains the sample. This RF field is uniform along the entire axial extent of the sample, thus submitting all of the sample undergoing an EPR measurement to the same RF excitation. A characteristic of the invented resonator is that the RF magnetic field remains constant over the axial length of the resonator central section regardless of its length. For nonlinear continuous wave (cw) experiments including progressive saturation, electron-electron double resonance and multiquantum EPR, all portions of a line sample lying along its axis experience the same magnitude of rf magnetic field $H_1$, which improves the quality of the data compared to cases where the field varies as a cosine along the sample. Similarly, for pulse experiments, the tip angle is constant along the sample. In addition to improved quality of data resulting from uniform rf magnetic field over the sample, there are situations where sensitivity can be expected to improve.

Figure 2:
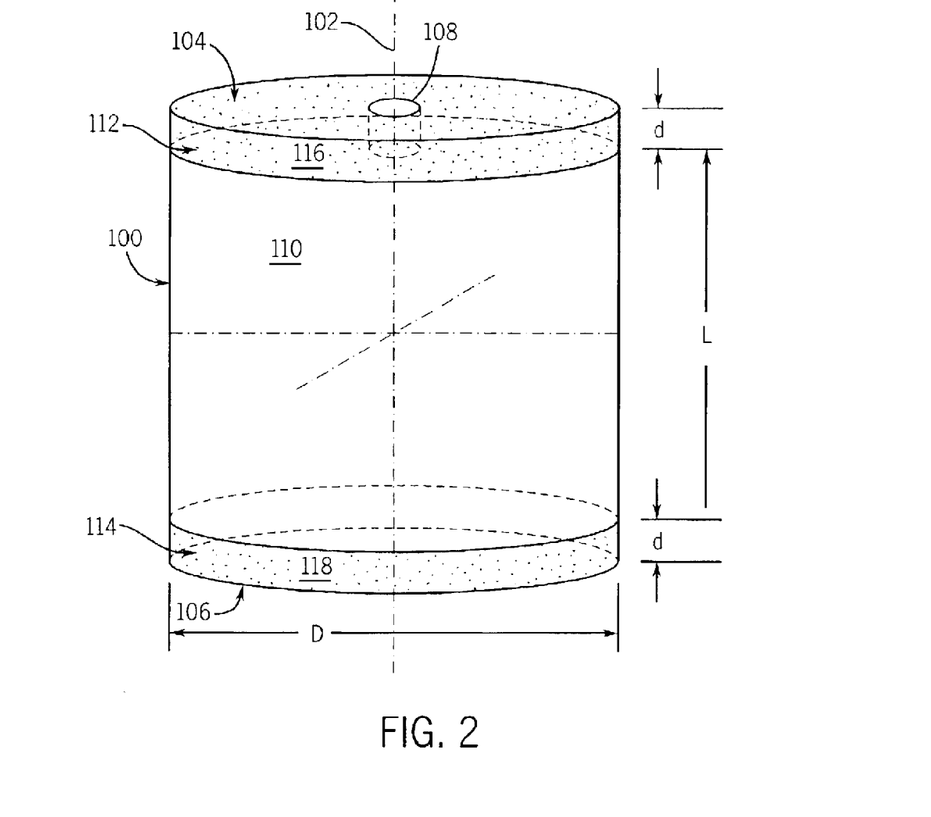
FIG. 2 is a diagram of a first preferred embodiment of a resonator according to the present invention.
Figure 3:
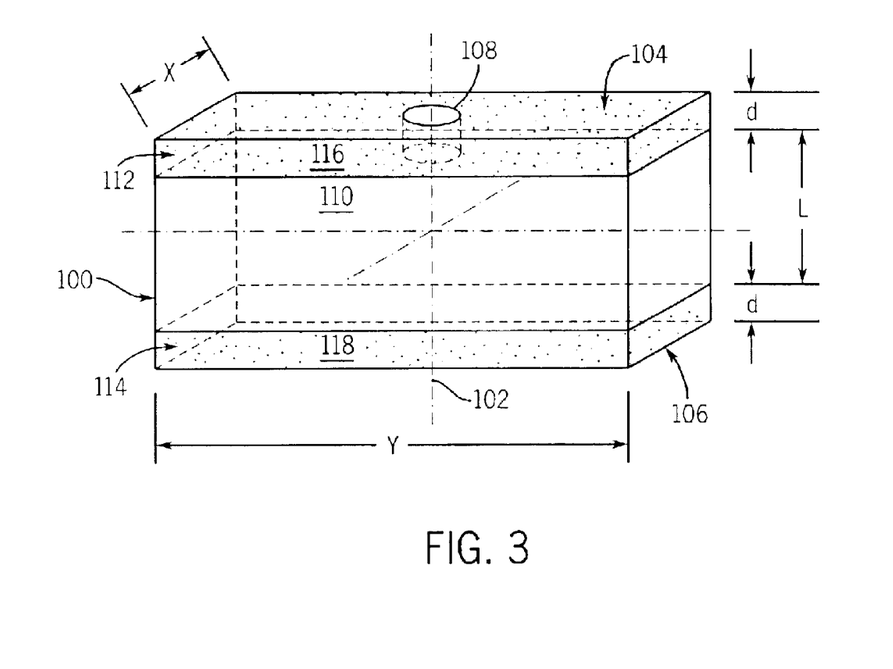
FIG. 3 is a diagram of a second preferred embodiment of a resonator according to the present invention.

Referring particularly to FIGS. 2 and 3, a first preferred embodiment of the resonator is formed by an enclosed conductive wall 100 that extends along a central axis 102 and is terminated at both ends by conductive end walls 104 and 106. The end wall 104 includes a sample opening 108 through which a sample tube (not shown in FIGS. 2 and 3) may be inserted to position a sample contained therein along the central axis 102 inside the resonator cavity.

The cross-section of the resonators in FIGS. 2 and 3 is uniform throughout its axial length. In the embodiment of FIG. 2 this cross-section is a circle having diameter D and in the embodiment of FIG. 3, this cross-section is a rectangle having dimensions X and Y. Both uniform-field resonators have three sections disposed along the central axis 102: a central cavity section 110 having a length L; and a pair of end sections 112 and 114 adjacent respective end walls 104 and 106. The cross-section of the central cavity section 110 is sized to support a selected transverse electric field ("TE") wave propagation mode at its cutoff frequency.

As is well known in the waveguide art, TE refers to a wave propagation mode in which the electric field (E) is purely transverse with respect to the propagation axis of the waveguide. In a Cartesian coordinate system (x,y,z) with the wave propagation axis along the z-axis, the transverse direction lies in the transverse plane defined by the x and y axes. A two-digit subscript convention (e.g. $TE_{10}$) is used with waveguides to describe the number of half-period variations in the electric field along the x-axis (first subscript) and the y-axis (second subscript). Typically, the first subscript digit indicates the number of half-period variations in the electric field E with respect to the x-axis, and the second digit indicates the number of half-period variations in the electric field E with respect to the y-axis. With a rectangular waveguide, the transverse plane is the cross section of the waveguide, the x-axis is directed along the long waveguide cross-sectional dimension and the y-axis is directed along its short dimension. With a cylindrical waveguide a cylindrical coordinate system (r, θ, z) is used with the transverse plane being a circular cross-section of the waveguide having a radius R. In this case the first digit in the two-digit subscript refers to the number of half-period variations of $E_\theta$ with respect to θ and the second digit refers to the number of half-period variations of $E_\theta$ with respect to r. In the preferred embodiments described below the cylindrical transverse electric wave propagation mode $TE_{01}$ is employed.

It should be noted that this convention is different for cavity resonators. Most importantly, a third subscript is added to the wave propagation index in cavity resonators to indicate the number of half-period variations of the "standing wave" electric field along the propagation axis and the coordinate system is rotated in the rectangular case. In the present invention, however, the electric field (and the magnetic field) are substantially uniform along the propagation axis of the central cavity section when considered a waveguide. Because the fields in the center cavity section are substantially uniform along this axis, we designate the index for this axis with a letter "u" in the description below. In a conventional cavity resonator this index is typically 1. For a further explanation of the various transverse electric (TE) and transverse magnetic (TM) wave propagation modes and cavity modes, reference is made to "Fields and Wave in Communication Electronics", by S. Ramo, J. R. Whinnery and T. H. Van Duzer, published in 1965 by Wiley N. Y.

As is well known in waveguide theory, the cutoff frequency is the frequency below which an RF signal will not propagate along the axial length of the waveguide. The cutoff frequency is an unstable operating condition for propagating a wave along a waveguide, but we have discovered that this condition establishes a new and highly desirable resonator when the central cavity section 110 is properly terminated at each end. The relationship of cutoff frequency $f_c$ to the cross-section dimensions of the circular and rectangular resonators of FIGS. 2 and 3 for various waveguide modes of operation are given in Table 1.

TABLE 1

|  | Mode | Cutoff formula |
|---|---|---|
| Rectangular | $TE_{20}$ | $f_c = c/Y$ |
|  | $TE_{10}$ | $f_c = c/2Y$ |
| Circular | $TE_{01}$ | $f_c = 3.832\, c/\pi D$ |
|  | $TE_{11}$ | $f_c = 1.841\, c/\pi D$ |

Where: c = speed of light in free space.

To support the new axially uniform field resonator mode of operation in the central cavity section 110, the end sections 112 and 114 must enclose the ends without disturbing the field in the central cavity section 110. When the uniform-field conditions are established, the electric and magnetic fields at each end of the central cavity section 110 are well matched to those of the end sections 112 and 114 and the entire structure resonates at the selected cutoff frequency. This is accomplished in the embodiments of FIGS. 2 and 3 by inserting dielectric slabs 116 and 118 in the respective end sections 112 and 114. These slabs 116 and 118 have a thickness corresponding to ¼ of a dielectric-filled waveguide wavelength at the resonator frequency, or equivalently, ¼ of a free space waveguide wavelength reduced by the factor $(\epsilon_r-1)^{1/2}$, where $\epsilon_r$ is the dielectric constant of the slabs 116 and 118. This ¼ wavelength end section resonator satisfies the boundary conditions of an open circuit at the boundary with the central cavity section 110 and a short circuit at its end conductive wall 104/106.

The particular cylindrical resonator of FIG. 2 was built with dimensions D=4.44 cm, and a length that could be varied from L=6.88 to 7.59 cm by turning one end cap, which was supported on a threaded shaft, in or out. The cavity was made of aluminum, and standard m>0 azimuthal mode suppression techniques were implemented on each end. A Teflon dielectric ($\epsilon_r$=2.08 at 10 GHz) of thickness d=0.91 cm (and the same radius as the cavity) was placed at each end. For these dimensions, the resonator was excited using a small loop at the end of a SMA coaxial transmission line located at the center of the cylindrical cavity wall. A mode at frequency 8.185 GHz was observed to have a magnetic field on axis 102 that was uniform throughout the central region 110 of the cavity. Moreover, the magnetic field increased from zero at the cavity end walls 104 and 106 to a maximum at the boundaries of end sections 112 and 114 and the central cavity section 110. The length of the cavity 110 was varied by turning the movable end cap. The frequency of the resonant mode was observed to be independent of cavity length.

The uniform-field supporting end sections 112 and 114 in the first embodiments of FIGS. 2 and 3 are each ¼ wavelength long and filled with a dielectric material. It has been discovered that other uniform-field supporting end sections are possible which do not require the use of a dielectric material. As illustrated by the embodiments in FIGS. 4 and 5, one other strategy for obtaining the desired end termination can be achieved by increasing a cross-sectional dimension of each end section.

Figure 4A:
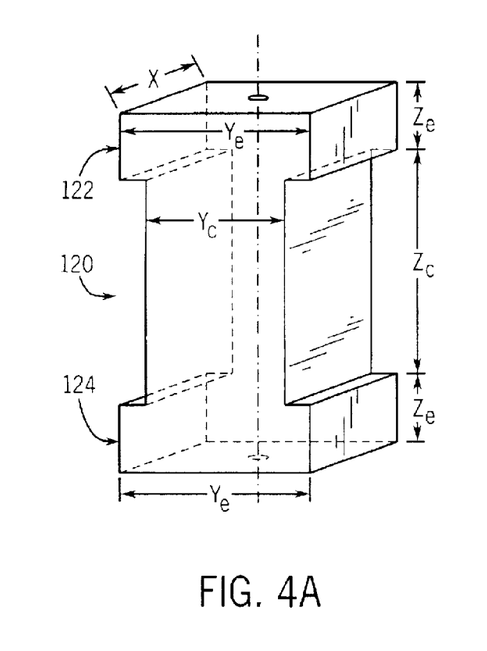
FIGS. 4A–4C are diagrams of a third preferred embodiment of a resonator according to the present invention.

Referring particularly to FIG. 4A, a rectangular resonator using this strategy has a central cavity section 120 and two enclosing end sections 122 and 124 formed of a conductive material. The central cavity section 120 has a cross-sectional dimension $Y_c$ set to the desired cutoff frequency as discussed above. The length $Z_c$ of this central cavity section 120 can be set to any value suitable for receiving the sample to be examined. Rectangular end sections 122 and 124 enclose respective ends of the central cavity section 120 and their cross-sectional dimension $Y_e$ and their axial dimension $Z_e$ are set to support the uniform RF field produced in the central cavity section 120. The end section dimension $Y_e$ is larger than the central cavity section dimension $Y_c$ such that the end section conductive walls step laterally outward. As a general design guide, each uniform-field supporting end section 122 and 124 is one-half of a cavity that resonates at the cutoff frequency of the central cavity section 120.

One approach for producing these structures is to choose a complete cavity to serve as the end structure, slice it in half, and place it on the end of the central cavity section to form an enclosed conductive structure. Then, a dimension (e.g., radius or axial length of the end section) is adjusted until the resonance eigenmode frequency of the combined structure matches the theoretical cutoff frequency of the central cavity section. When the frequencies match, the end sections are properly supporting the uniform field conditions in the central cavity section. When designing the end section in this fashion, symmetry should be maintained at both ends of the central cavity section. Once one achieves a proper end section design, however, this symmetry is not required and end sections of different designs can be used on opposite ends of the central cavity section without disturbing the uniform field condition.

The dimensions of a number of exemplary rectangular uniform-field resonators such as that shown in FIG. 4A are listed in TABLE 2 for resonant frequency of 9.5 GHz.

TABLE 2

| Mode | Yc | Ye | Ze |
|---|---|---|---|
| $TE_{u02}$ | 3.156 cm | 4.198 cm | 1.5 cm |
| $TE_{u02}$ | 3.156 cm | 20 cm | 1.362 cm |

Figure 4B:
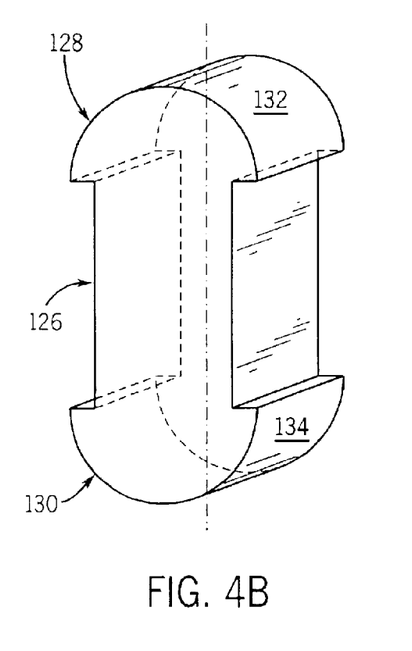
Figure 4C:
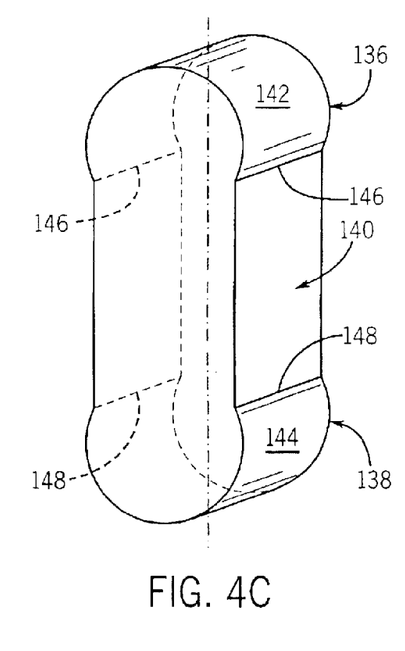

Two additional resonators which are variations of the rectangular resonator depicted in FIG. 4A are depicted in FIGS. 4B and 4C. In the variation of FIG. 4B a central cavity section 126 having a rectangular cross-section is enclosed by end sections 128 and 130. As with the embodiment of FIG. 4A, the end sections 128 and 130 have the same depth as the central cavity section 126, but they step laterally outward to increase the cross-sectional area of the end sections 128 and 130 at their junction with the central cavity section 126. Unlike the embodiment of FIG. 4A, however, respective end walls 132 and 134 are curved to form cylindrical arcs.

The resonator depicted in FIG. 4C is similar to that depicted in FIG. 4B, but the sharp lateral step in the dimension of end sections 136 and 138 from the dimension of central cavity section 140 is not present. Instead, circular cylindrical end walls 142 and 144 have a diameter larger than the width of the central cavity section 140 and they arc laterally outward from the respective junctures 146 and 148 with the central cavity section 140. The end sections 136 and 138 have the increased size needed to properly terminate the ends of the uniform-field central cavity section 140, but without the sharp steps in the resonator walls which cause current build up at the corners and a resulting lowering of the resonator Q.

Figure 5A:
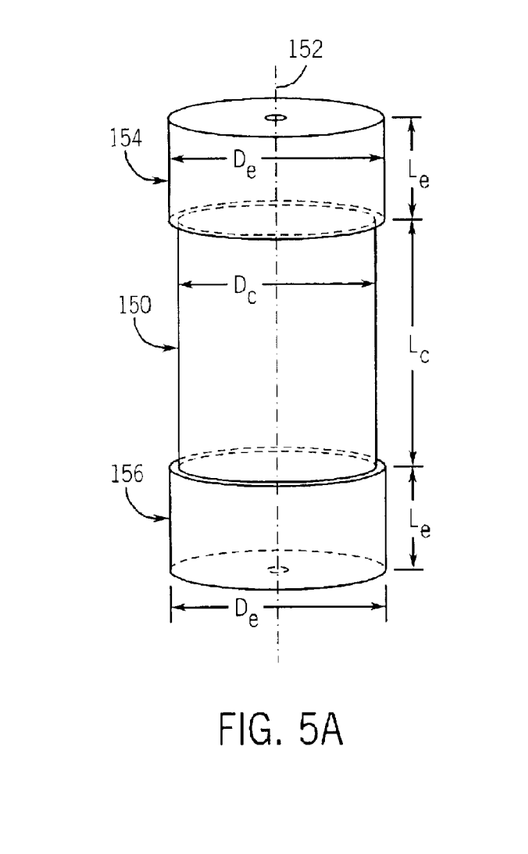
FIGS. 5A–5C are diagrams of a fourth preferred embodiment of a resonator according to the present invention.
Figure 5B:
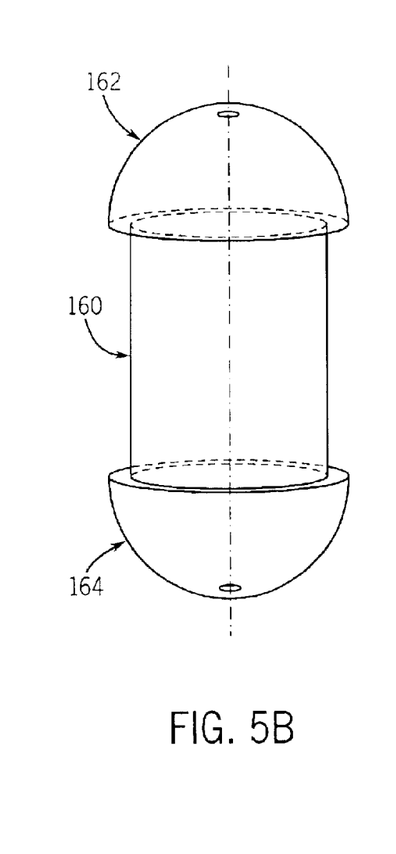
Figure 5C:
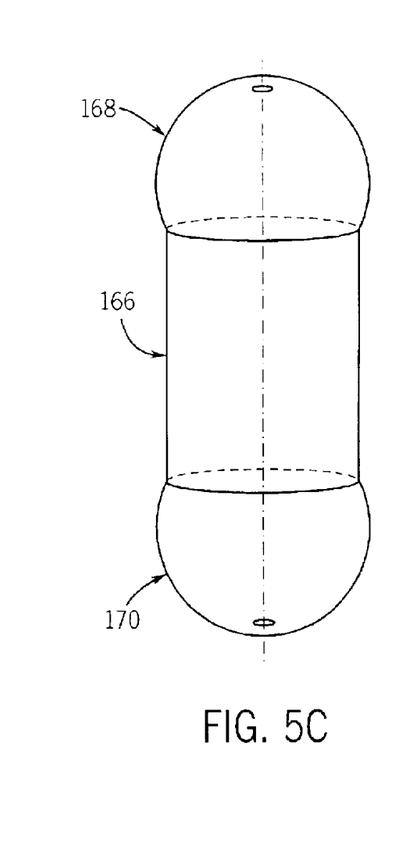

The strategy employed in the rectangular resonators of FIGS. 4A–4C can also be employed with a cylindrical resonator architecture as shown in FIGS. 5A–5C. Referring particularly to FIG. 5A, a central cavity section 150 is formed by a circular cylindrical conductive wall having a diameter $D_c$ which is set to the cutoff frequency for the selected transverse electric field wave propagation mode and RF frequency. The design of the central cavity section 150 is the same as that discussed above with respect to the embodiment in FIG. 2. The length $L_c$ of this central cavity section 150 can be any value suitable for receiving samples disposed along central axis 152 and it will support a substantially uniform RF magnetic field along this entire length in the region near its center.

The ends of the central cavity 150 are enclosed by circular cylindrical end sections 154 and 156. The diameter $D_c$ and length $L_c$ of each end section 154 and 156 are set to values which support the uniform-field in the central cavity section 150. As with the rectangular structure discussed above, each uniform-field supporting end section 154 and 156 is one-half of a cavity that resonates at the cutoff frequency of the central cavity section 150.

The dimensions of a number of exemplary cylindrical resonators such as that shown in FIG. 5A are listed in TABLE 3 for a resonant frequency of 9.5 GHz.

TABLE 3

| Mode | Dc | De | Le |
|---|---|---|---|
| $TE_{01u}$ | 3.849 cm | 4.283 cm | 2.00 cm |
| $TE_{01u}$ | 3.849 cm | 5.080 cm | 1.562 cm |
| $TE_{01u}$ | 3.849 cm | 20.0 cm | 1.432 cm |

Two additional resonators which are variations of the cylindrical resonator depicted in FIG. 5A are depicted in FIGS. 5B and 5C. The resonator in FIG. 5B has a circular cylindrical central cavity section 160 similar to the central cavity section 150 shown in FIG. 5A, and two spherical-shaped end sections 162 and 164. The diameter of the end sections 162 and 164 at their juncture with the central cavity section 160 is larger than the cutoff diameter $D_c$ by an amount which meets the uniform-field supporting requirement. This forms a lateral step in the conductive wall at each end of the central cavity section 160.

The resonator depicted in FIG. 5C has a similar circular cylindrical central cavity section 166 enclosed at each end by respective spherical-shaped end sections 168 and 170. In this embodiment the sharp lateral step in the resonator wall at each end of the central cavity section 166 is substantially eliminated by connecting the spherical wall of each end section 168 and 170 directly to the central cavity section wall. The diameter of the spherical end section is larger than the diameter of the central cavity section 166, and as a result, the spherical end sections 168 and 170 extend laterally outward therefrom sufficiently to meet the uniform-field supporting requirement.

Figures 6A, 6B:
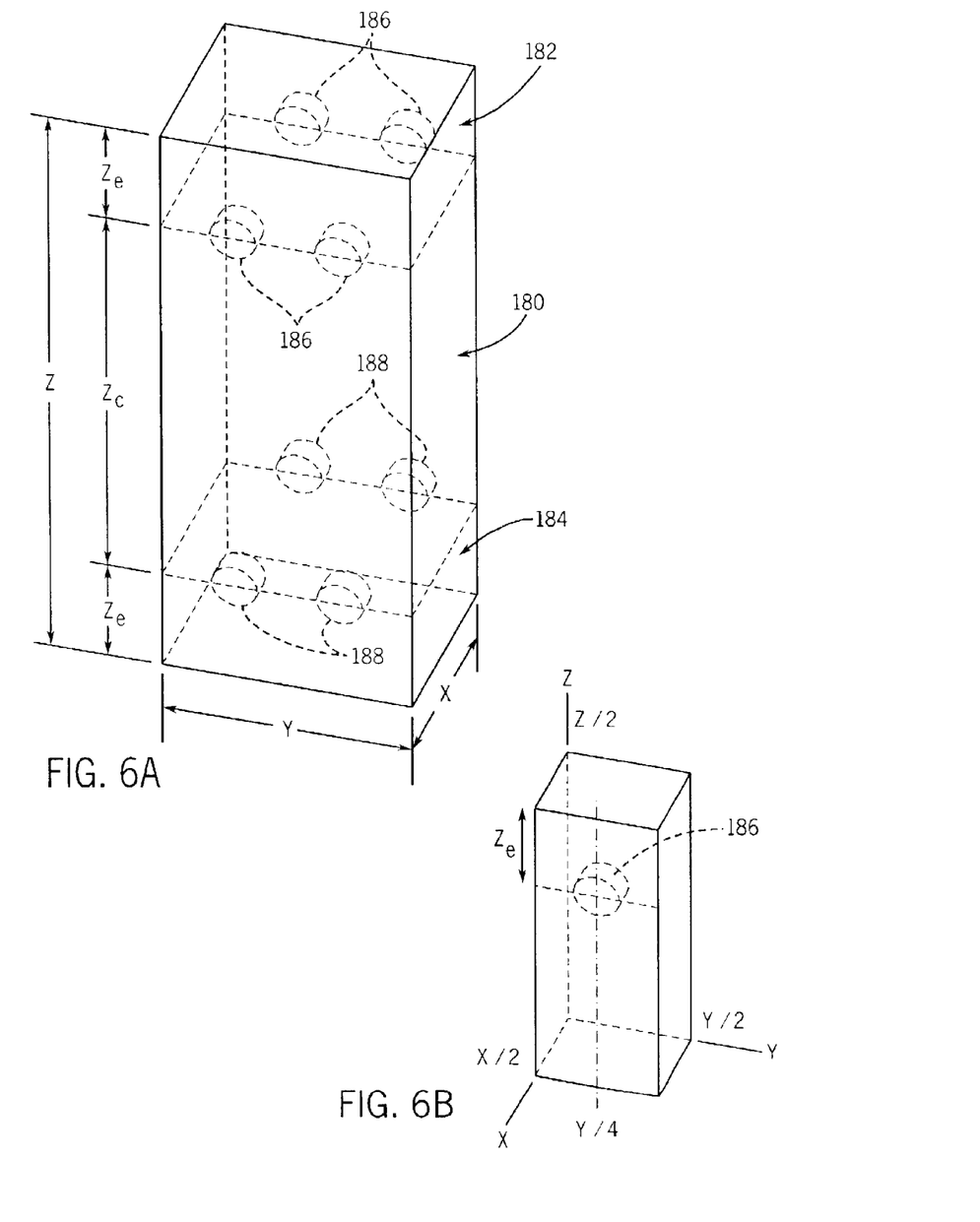
FIGS. 6A–6B are diagrams of a fifth preferred embodiment of a resonator according to the present invention.
Figures 7A, 7B, 7C:
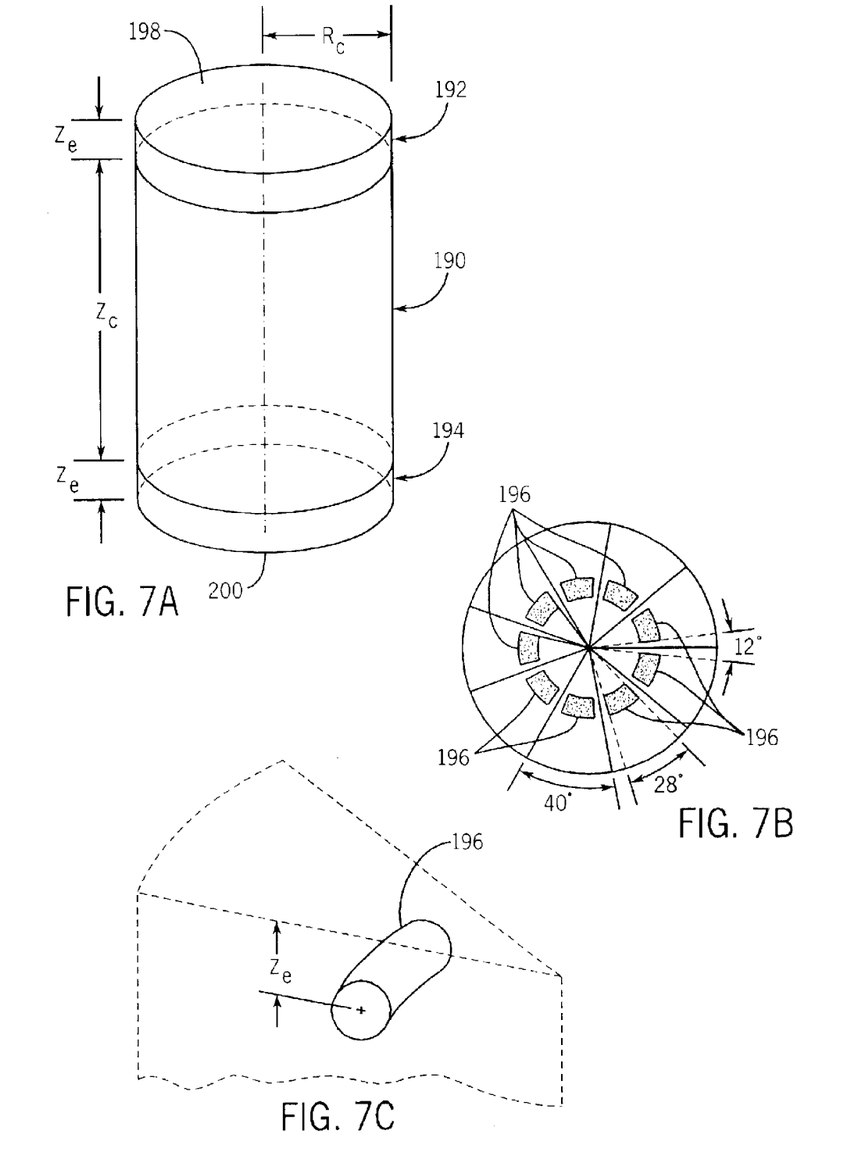
FIGS. 7A–7C are diagrams of a sixth preferred embodiment of a resonator according to the present invention.

Another strategy for constructing a uniform-field resonator according to the present invention is to add re-entrant conductive structures into the end sections at locations parallel to the RF electric field in the resonator standing-wave patterns. These effectively make the end section cavities larger in order to support the uniform-field conditions. As depicted in FIGS. 6 and 7, the re-entrant structures enable the uniform-field supporting conditions to be met without changing the shape or dimensions of the end section conductive walls.

Referring particularly to FIG. 6A, a uniform-field resonator of rectangular shape includes a central cavity section 180 which has a cross-sectional dimension Y set to the desired cutoff frequency as described above for a $TE_{20}$ wave propagation mode of operation. The length $Z_c$ of this central cavity section 180 is set to a value suitable for receiving the sample to be examined. Rectangular end sections 182 and 184 enclose respective ends of the central cavity section 180 and their cross-sectional dimensions X and Y are the same as the central cavity section 180. The boundary between each rectangular end section 182 or 184 and the center cavity section 180 is defined by a set of eight re-entrant conductive rods 186 and 188 respectively which mount to the walls of the end sections and extend into the end cavities. Each re-entrant conductive rod 186 and 188 has a radius r and extends into the cavity a distance $X_R$. The rods 186 and 188 are positioned on opposing walls of the rectangular resonator at locations where they extend parallel to the RF electric field in the $TE_{20}$ wave propagation mode of operation. As shown in FIG. 6B, the resonator of FIG. 6A can be divided into eight identical bricks and the fields in one brick may be solved and used to locate the re-entrant structures in all bricks, since the relative field distributions are the same. There are three parameters which may be varied to establish the uniform-field support condition: the rod radius r; the rod depth of penetration into the cavity $X_R$; and the distance of the rod from the cavity end wall $Z_e$.

In the preferred embodiment shown in FIG. 6A, the rectangular resonator is dimensioned to operate in the $TE_{u02}$ mode at 9.5 GHz. The X dimension is set to 2.0 cm and the Y dimension is adjusted to cut off at this frequency (i.e., Y=3.156 cm). Taking into consideration factors such as resonator Q and filling factor, it was found that the radius of re-entrant rods 186 and 188 can be in the range of 1.5 to 3.0 mm and in this particular embodiment they are set to 1.5 mm. Similarly, the distance $Z_e$ of each re-entrant rod 186 and 188 from its resonator end wall was set to 0.789 cm in view of resonator Q and filling factor considerations. With these dimensions set, the depth of penetration $X_R$ of the re-entrant rods 186 and 188 was determined by moving them into the cavity until the selected cutoff frequency of 9.5 GHz is established. When this is achieved, the uniform RF magnetic field along the z-axis in the central cavity section 180 results. The best results were obtained with a penetration depth of $X_R$=0.35 cm.

When a sample is inserted into the central cavity section 180, the resonator will no longer resonate precisely at the cutoff frequency. This is due to the dielectric properties of the sample itself and the sample holder. The resulting RF magnetic field along the sample will not in this case be precisely uniform. Applicants have discovered that in many EPR applications this non-uniformity is inconsequential, however, in applications where it is significant, adjustments can be made. In the preferred embodiment the resonator resonant frequency is adjusted to the cutoff frequency by changing the lengths of the conductive rods 186 and 188. This is achieved by threading the end of each conductive rod 186 and 188 and inserting it into a threaded opening in the resonator wall. By turning each rod 186 and 188, the distance it extends into the cavity can be adjusted.

Re-entrant conductive structures can also be used in the end sections of a cylindrical resonator to establish the uniform-field conditions. Such a resonator is shown in FIGS. 7A–7C, where a circular cylindrical cavity section 190 is enclosed at each end by circular cylindrical end sections 192 and 194 of the same diameter. Uniform-field conditions are established with each end section 192 and 194 by a set of nine curved re-entrant rod sections 196 which are disposed in a coaxial circle and spaced from end wall 198 and 200 a distance $Z_e$. In the preferred embodiment the distance Ze=0.635 cm. In the preferred embodiment the cylindrical resonator is designed to operate at 9.5 GHz and the resonator cavity radius $R_c$ is set to cutoff value of $R_c$=1.924 cm. The resonator is operated in the $TE_{01u}$ mode and the diameter of the ring of re-entrant rods 196 is set to 1.8494 cm and each rod 196 has a diameter of 0.3175 cm.

In the above preferred embodiments of the invention both end sections are identical to each other. This is not necessary. For example, any of the end sections for rectangular central sections disclosed in FIGS. 3, 4 and 6 can be used together on the same resonator. Similarly, any of the end sections for cylindrical central sections disclosed in FIGS. 2, 5 and 7 can be used together on the same resonator.

A design criteria of this new "uniform-field" resonator is that the symmetries of the RF fields at the interface between each end section and the center cavity section should be substantially the same, but that there can be a mismatch between the ideal RF field distributions. In the uniform-field resonators with dielectric filled end sections (FIGS. 2 and 3), both the symmetries and the RF field distributions match at the interface and the transition between the uniform-field cutoff propagation behavior in the center cavity section and normal microwave cavity resonance behavior in the end sections occurs over a negligible axial distance. In the other uniform field resonators described above, departures from ideal RF field distributions occur in regions on either side of the interface between the center cavity section and the end sections, producing what we term "transition zones". The better the match of the ideal RF field distributions, the shorter is the length of this transition zone.

Figure 8:
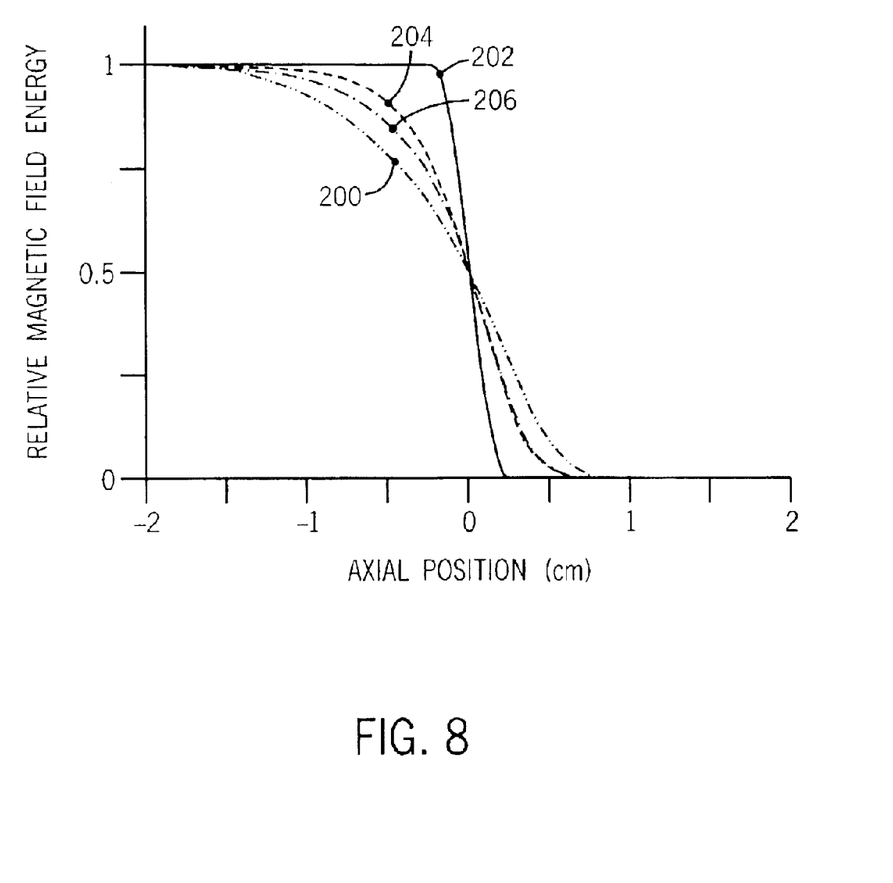
FIG. 8 is a graph illustrating the magnetic field energy as a function of axial position in transition zones of the resonators of FIGS. 3, 4A and 6A.

Transition zones along the sample axis for the rectangular uniform-field resonators of FIGS. 3, 4A and 6A are compared in FIG. 8. In this figure, the RF magnetic field in the central cavity section is normalized to unity for each resonator. Values of $H_1^2$ in the transition zone were calculated for each resonator, and the positions along the z-axis forced to coincide at $H_1^2=0.5$. If a resonator is probed with a point-sample, the EPR signal varies as $H_1^2$ because of the appearance of this term in the numerator of the expression for the filling factor.

The rectangular resonator of FIG. 4A has transition zones indicated by line 200 that are relatively wide. This width arises from the discontinuity of cross-sections at the interface between the end sections 122, 124 and the center cavity section 120. The transition zone in the dielectric resonator of FIG. 3 is very sharp as shown by line 202, but there is no provision for sample access. When a hole 108 is made in the dielectric for sample access the transition zone indicated by dashed line 204 results and is similar in shape to the transition zone indicated by dotted line 206 of the re-entrant geometry of FIG. 6A.

While the transition zone is sharp, the Q of the dielectric uniform field resonators of FIGS. 2 and 3 is substantially lower than the uniform field resonators of FIGS. 4–7. This loss of Q arises not only from dielectric loss, but also because of higher ohmic loss in the end section walls associated with the high RF magnetic field at the walls. The dielectric loss can be reduced by using quartz with a minimum amount of impurities.

The Q-value of uniform field resonators constructed as shown in FIGS. 4–7 are substantially the same when used in an EPR spectrometer. The Q-values of resonators in FIGS. 4 and 5 are somewhat degraded by high wall currents near the lateral step and in the resonators in FIGS. 6 and 7 by high currents on the surface of the re-entrant rods. These losses are relatively small compared to losses in the complete resonator structures.

Figure 9:
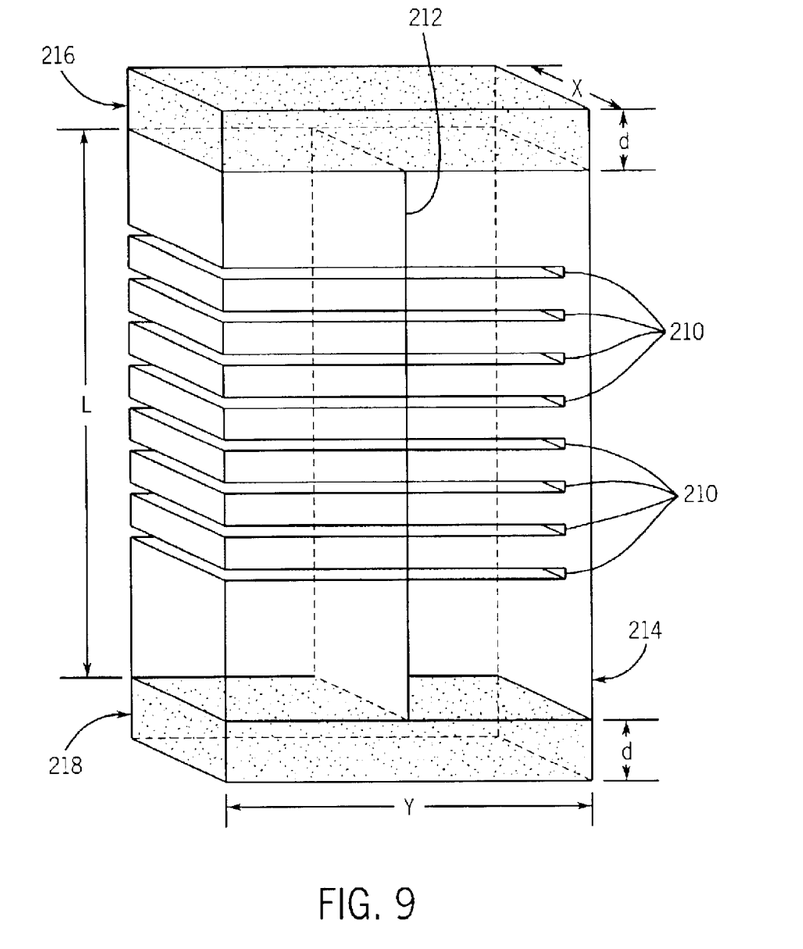
FIG. 9 is a diagram of an alternative embodiment of the resonator of FIG. 3.

A characteristic of all the uniform field resonators of the present invention is that currents in the central cavity section lie in planes substantially perpendicular to the central axis along which the sample lies. As shown in FIG. 9, slots 210 can thus be cut in the central cavity section walls which are parallel to these current paths without a substantial loss of Q. These slots enable magnetic field modulation signals used in some EPR measurements to penetrate the resonator wall and affect the fields applied to a sample 212 contained therein. It has long been known that such cuts can be made in the walls of cylindrical cavity resonators operating in the $TE_{011}$ mode to allow penetration of static magnetic modulation fields. However, this technique has not previously been possible with rectangular shaped cavity resonators.

Referring still to FIG. 9, the rectangular shaped uniform-field resonator of the present invention is particularly well suited for performing EPR measurements on aqueous samples 212 lying in a plane. By operating the uniform-field resonator in a $TE_{u02}$ mode, a nodal plane of zero electric field is produced at the center of the center cavity section 214. By placing the planar sample 212 in this nodal plane, it may be subjected to a substantially uniform RF magnetic field without undue heating caused by the electric field. While the end sections 216 and 218 in the embodiment of FIG. 9 employ the dielectric material strategy, it should be apparent to those skilled in the art that the other end section construction strategies described above may also be used.

The center cavity sections described above have been considered either as cylindrical or rectangular transmission lines operating in the $TE_{10}$ or $TE_{20}$ propagation modes, respectively. Numerous other transverse electric propagation modes exist for different symmetries, each with a particular cutoff frequency. For each propagation mode, resonant cavities can be found with the same symmetry, designed to resonate at the cutoff frequency, and conceptually cut in half to form end sections. Specifically, overmoding, viz $TE_{n0}$ rectangular, where n=2, 4, etc. or $TE_{0n}$ cylindrical where n=1, 2, etc. is sometimes convenient, particularly at high microwave frequencies. For example, these resonators can be expected to have higher Q-values that may improve the performance of automatic frequency control (AFC) circuits.

In the preferred embodiments described herein the cross-section of the central cavity section is either rectangular or cylindrical because these shapes are commonly used in EPR. However, other cross-sectional shapes may be employed as long as this shape is maintained throughout the axial length of the central cavity section. If such a non-analytic cross-section is employed, one can calculate the cutoff frequency $f_c$ of this cross-section from the resonant frequency $f_z$ of a finite length section of length Z using the relationship $$f_c = \sqrt{f_z^2 - (c/2Z)^2},$$

where c is the speed of light.

A benefit of the uniform field resonators of the present invention is improved data quality in so-called non-linear EPR experiments that are based on microwave power saturation. These experiments include CW saturation, spin echo EPR in all variants, free induction decay (FID), saturation recovery EPR, electron-electron double resonance (ELDOR), pulse ELDOR, electron-nuclear double resonance (ENDOR) in all experimental variants, nuclear Overhauser experiments, multiquantum EPR and more. The customary experimental practice in these experiments is to adjust the microwave power empirically until the signal intensity is a maximum. In the case of prior art cavity resonators with variation of the microwave magnetic field along the sample, the portions of the sample near the center of the resonator will tend to have too much incident power in order to increase the contributions to the signal from portions of the sample that lie more remote from the center.

The present invention reduces this problem by providing a substantially uniform magnetic field strength along the entire axial length of the sample.

Pulse experiments are particularly problematic when using conventional cavity resonators because the tip angle varies along the sample axis. Moreover, in EPR it is not usually possible to deliver a pulse of sufficient RF amplitude that the entire spectrum is saturated. Thus, the width of the spectral region that is excited varies along the sample axis. Uniform-field resonators overcome this difficulty, leading to improved signal quality. In addition, studies designed to understand the underlying relaxation mechanisms that are central to non-linear EPR experiments are facilitated, since the experimental observable is no longer an integral over responses along the sample to different RF fields.

Microwave resonators constructed according to the present invention may have applications other than EPR. Such resonators are used in other branches of radio frequency spectroscopy, in particle accelerators, and in a variety of practical devices such as cooking apparatus, heating apparatus and drying apparatus.

What is claimed is:

1. A uniform-field microwave cavity resonator, the combination comprising:
   a central cavity section formed by a conductive wall which surrounds a central cavity and defines two open ends, the central cavity section having cross-sectional dimensions set to establish a cutoff condition for a selected transverse electric (TE) wave propagation mode and frequency;
   a first uniform-field supporting end section connected to one end of the central cavity section and substantially enclosing the one end with a first conductive end wall; and
   a second uniform-field supporting end section connected to the other end of the central cavity section and substantially enclosing the other end with a second conductive end wall.

2. The resonator as recited in claim 1 in which one of said uniform-field supporting end sections includes a dielectric material disposed against its conductive end wall and the thickness and dielectric constant of said dielectric material are selected to support the uniform field in the central cavity section.

3. The resonator as recited in claim 2 in which the dielectric material is quartz.

4. The resonator as recited in claim 2 in which the end section which includes the dielectric material has a cross-section which is substantially the same as the cross-section of the central cavity section.

5. The resonator as recited in claim 4 in which the cross-section is a rectangle.

6. The resonator as recited in claim 5 in which the transverse electric wave propagation mode is $TE_{20}$ or $TE_{10}$.

7. The resonator as recited in claim 4 in which the cross-section is a circle.

8. The resonator as recited in claim 7 in which the transverse electric wave propagation mode is $TE_{01}$ or $TE_{11}$.

9. The resonator as recited in claim 1 in which one of said uniform-field supporting end sections includes a surrounding conductive wall that defines an end cavity having a cross-sectional dimension larger than a corresponding cross-sectional dimension of the central cavity section and a dimension of the end section is selected to support the uniform field in the central cavity section.

10. The resonator as recited in claim 9 in which the cross-section of the central cavity section is a rectangle and the surrounding conductive wall of said uniform-field supporting end section is shaped to define a rectangular end cavity.

11. The resonator as recited in claim 9 in which the cross-section of the central cavity section is a rectangle and the surrounding conductive wall of said uniform-field supporting end section is curved to define a cylindrical arc.

12. The resonator as recited in claim 11 in which the diameter of the cylindrical arc is larger than one cross-sectional dimension of the central cavity section and the length of the cylindrical arc is substantially the same as another cross-sectional dimension of the central cavity section.

13. The resonator as recited in claim 9 in which the cross-section of the central cavity section is substantially circular and the surrounding conductive wall of said uniform-field supporting end section is shaped to define a cylindrical end cavity having a diameter larger than the diameter of the cross-section of the central cavity section.

14. The resonator as recited in claim 9 in which the cross-section of the central cavity section is substantially circular and the surrounding conductive wall of said uniform-field supporting end section is curved to define a spherical arc, and the diameter of the spherical arc is greater than the diameter of the cross-section of the central cavity section.

15. The resonator as recited in claim 1 in which one of said uniform-field supporting end sections includes a surrounding conductive wall that defines an end cavity having substantially the same cross-sectional dimensions as the central cavity section, and a re-entrant conductive rod extends into the end cavity and is dimensioned to support the uniform field in the central cavity section.

16. The resonator as recited in claim 15 in which the cross-section of the central cavity section and the surrounding conductive wall of said end section is substantially rectangular in shape and the re-entrant conductive rod is disposed on one side of said surrounding conductive wall.

17. The resonator as recited in claim 15 which includes a plurality of re-entrant conductive rods, and said plurality of re-entrant conductive rods are disposed on the surrounding conductive wall.

18. The resonator as recited in claim 17 in which the plurality of re-entrant conductive rods are positioned on the juncture of the central cavity section and the end section.

19. The resonator as recited in claim 18 in which the cross-section of the central cavity section and the surrounding conductive wall of said end section is substantially rectangular in shape.

20. The resonator as recited in claim 15 in which the one end section also includes a conductive end wall and the re-entrant conductive rod is comprised of sections disposed in a pattern spaced from the end wall.

21. The resonator as recited in claim 20 in which the re-entrant conductive rod sections are disposed in a transverse plane.

22. The resonator as recited in claim 20 in which the cross-section of the central cavity and the end cavity are substantially circular in shape.

23. The resonator as recited in claim 22 in which the re-entrant conductive rod sections are disposed in a ring.

24. A resonator which comprises:
   a central cavity section formed by a conductive wall which surrounds a central axis to form a cavity having a cross-section transverse to the central axis which is substantially uniform along the axial length of the central cavity section, the central cavity cross-section being shaped and dimensioned to support a wave propagation mode in which the electric field is transverse to the central axis, for electromagnetic energy applied at a selected frequency, and a dimension of the central cavity cross-section is set to the cutoff condition for said wave propagation mode at said selected frequency; and two end sections, each disposed at a respective one of two ends of the central cavity section, said two end sections enabling the central cavity section and two end sections to resonate at the selected resonant frequency.

25. The resonator as recited in claim 24 in which one of said end sections includes a conductive end wall and a dielectric material is disposed against its conductive end wall having a thickness selected to enable the central cavity section and two end sections to resonate at said selected frequency.

26. The resonator as recited in claim 24 in which one of said end sections includes a surrounding conductive wall that defines an end cavity having a cross-sectional dimension larger than the cross-sectional dimensions of the central cavity section and a dimension of the end section is selected to enable the central cavity section and two end sections to resonate at said selected frequency.

27. The resonator as recited in claim 24 in which one of said end sections includes a surrounding conductive wall that defines an end cavity having substantially the same cross-sectional shape and dimension as the central cavity section, and a re-entrant conductive rod extends into said end cavity and is dimensioned and positioned to enable the central cavity section and two end sections to resonate at said selected frequency.

28. A microwave resonator which comprises a central section which extends along a central axis for a selected length and which has a cross-section transverse to the central axis which is substantially uniform along the axial length of the central section, the shape and size of the central section cross-section being selected to support a wave propagation mode at a selected frequency in which an electric field is directed transverse to the central axis, and a dimension of the central section cross-section is set to the cutoff condition for the wave propagation mode at the selected frequency.

29. The microwave resonator as recited in claim 28 which includes two end sections, each disposed at a respective one of two ends of the central section, said two end sections substantially enclosing the ends of the central section while enabling the central section and two end sections to resonate at the selected resonant frequency.

30. The resonator as recited in claim 29 in which one of said end sections includes an end wall and a dielectric material is disposed against its end wall having a thickness selected to enable the central section and two end sections to resonate at said selected frequency.

31. The resonator as recited in claim 29 in which one of said end sections includes a surrounding wall that defines an end cavity having a cross-sectional dimension larger than the cross-sectional dimensions of the central section and a dimension of the end cavity is selected to enable the central section and two end sections to resonate at said selected frequency.

32. The resonator as recited in claim 29 in which one of said end sections includes a surrounding wall that defines an end cavity having substantially the same cross-sectional shape and dimension as the central section, and a re-entrant conductive rod extends into said end cavity and is dimensioned and positioned to enable the central section and two end sections to resonate at said selected frequency.

33. The resonator as recited in claim 28 in which the central section is formed by a conductive wall that extends around the central axis and has a substantially rectangular cross-sectional shape, and slots are formed through the conductive wall and oriented in a direction transverse to the central axis.

34. The resonator as recited in claim 28 in which the central section is formed by a conductive wall that extends around the central axis, and slots are formed through the wall and oriented in a direction transverse to the central axis.

* * * * *